(12) United States Patent
Lee et al.

(10) Patent No.: US 9,327,306 B2
(45) Date of Patent: May 3, 2016

(54) APPARATUS FOR DISPENSING FLUID

(71) Applicant: Samsung Display Co., Ltd., Gyeonggi-do (KR)

(72) Inventors: Sang-Jo Lee, Yongin (KR); Sung-Hwan Cho, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/259,396

(22) Filed: Apr. 23, 2014

(65) Prior Publication Data

US 2014/0326807 A1  Nov. 6, 2014

(30) Foreign Application Priority Data

May 6, 2013 (KR) .................. 10-2013-0050768

(51) Int. Cl.
| | |
|---|---|
| B05B 5/00 | (2006.01) |
| B05C 5/02 | (2006.01) |
| B05B 5/025 | (2006.01) |
| B05C 11/10 | (2006.01) |
| H01L 21/67 | (2006.01) |

(52) U.S. Cl.
CPC ............. B05C 5/0225 (2013.01); B05B 5/0255 (2013.01); B05C 11/10 (2013.01); H01L 21/6715 (2013.01); B05C 11/1039 (2013.01)

(58) Field of Classification Search
CPC .... B05C 5/0225; B05C 11/10; B05C 11/039; H01L 21/6715; B05B 5/0255
USPC .................. 239/103, 104, 124, 690, 708, 589
See application file for complete search history.

(56) References Cited

U.S. PATENT DOCUMENTS 5,862,986 A * 1/1999 Bolyard et al. ............... 239/124
6,446,702 B1   9/2002 Murakami et al.

FOREIGN PATENT DOCUMENTS

JP   2006-210580 A   8/2006
KR   10-2011-0105128 A   9/2011

* cited by examiner

*Primary Examiner* — Steven J Ganey
(74) *Attorney, Agent, or Firm* — Lee & Morse, P.C.

(57) ABSTRACT

An apparatus that dispenses a fluid onto a substrate includes a nozzle located in a position relative to the substrate to dispense the fluid onto the substrate and a blocking plate selectively disposed between the substrate and the nozzle.

8 Claims, 4 Drawing Sheets

(a)

(b)

(a)

(b)

(a)

(b)

(a)

(b)

(a)

(b)

APPARATUS FOR DISPENSING FLUID

CROSS-REFERENCE TO RELATED APPLICATION

Korean Patent Application No. 10-2013-0050768 filed on May 6, 2013, in the Korean Intellectual Property Office, and entitled: "APPARATUS FOR DISPENSING FLUID," is incorporated by reference herein in its entirety.

BACKGROUND

Embodiments relate to an apparatus that dispenses a fluid. More particularly, embodiments relate to an apparatus that dispenses a fluid onto a substrate.

SUMMARY

Embodiments are directed to an apparatus that dispenses a fluid onto a substrate. The apparatus includes a nozzle located in a position relative to the substrate to dispense the fluid onto the substrate, and a blocking plate selectively disposed between the substrate and the nozzle.

The blocking plate may include a blocking plate main body and a protruding portion on an end of the blocking plate main body, the protruding portion including a first inclined surface that is bent and extends upward from a surface of the blocking plate main body.

The protruding portion may further include a second inclined surface that is bent and extends in a direction toward the blocking plate main body from an end of the first inclined surface.

The end of the first inclined surface may protrude beyond an end of the blocking plate main body.

The apparatus may further include a negative potential supply unit connected with one of the blocking plate and the nozzle and generating a negative potential therein, and a positive potential supply unit connected with the other one of the blocking plate and the nozzle and generating a positive potential therein.

The apparatus may further include a connection unit connecting the nozzle and the blocking plate and selectively contacting the fluid.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
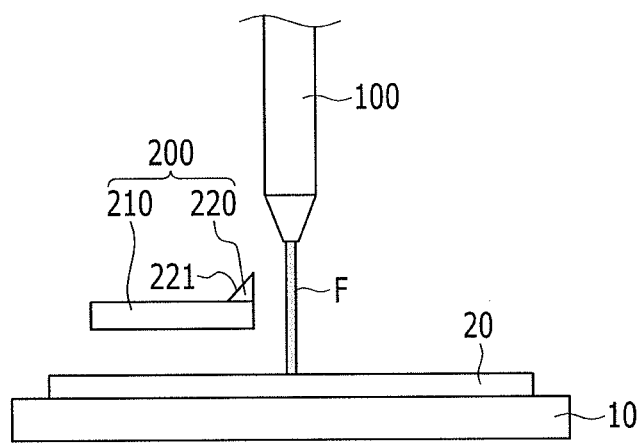
FIG. 1 schematically illustrates a side view of a fluid dispensing apparatus according to an exemplary embodiment.
Figure 1:
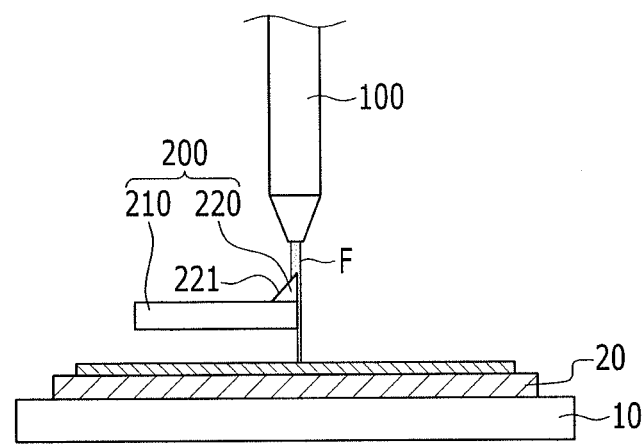

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Hereinafter, a fluid dispensing apparatus according to an exemplary embodiment will be described with reference to FIG. 1. A fluid dispensed by the fluid dispensing apparatus may be a solution including an organic material, a metal material, or an inorganic material, as examples.

FIG. 1 schematically illustrates a side view of a fluid dispensing apparatus according to an exemplary embodiment.

As shown in (a) of FIG. 1, a fluid dispensing apparatus according to this exemplary embodiment dispenses a fluid F to a target for dispensing, such as a substrate 20 mounted on the mounting plate 10, and includes a nozzle 100 and a blocking plate 200.

The nozzle 100 is located in a position relative to the substrate 20 to dispense the fluid F onto the substrate 20. The fluid F dispensed to the substrate 20 may form an insulation layer or a pattern portion. The nozzle 100 may be connected with any suitable structure that supplies the fluid F to the nozzle 100. For example, the nozzle 100 may be connected with a fluid supply unit (not shown) supplying the fluid F to the nozzle 100 and a fluid pump (not shown) disposed between the fluid supply unit and the nozzle 100 to pump the fluid F to the nozzle 100

The blocking plate 200 is disposed on the substrate 20, and may be selectively disposed between the substrate 20 and the nozzle 100. The blocking plate 200 may be selectively disposed between the substrate 20 and the nozzle 100 by sliding various structures. For example, electromagnets may be disposed at lateral end sides of the blocking plate 200 for providing sliding movement. In other implementations, a sliding guide portion provided to slide the blocking plate 200 may support the blocking plate 200.

The blocking plate 200 includes a blocking plate main body 210 and a protruding portion 220.

The blocking plate main body 210 may be formed in the shape of a plate, and may be selectively disposed between the substrate 20 and the nozzle 100 by sliding various structures.

The protruding portion 220 is disposed at an end of the blocking plate main body 210, and protrudes upward from the blocking plate main body 210. The protruding portion 220 includes a first inclined surface 221 that is bent and extends in an upper direction from a surface of the blocking plate main body 210. The first inclined surface 221 may extend in an inclined manner in a direction toward the nozzle 100.

As shown in (b) of FIG. 1, in fluid dispensing apparatus 1000 according to this exemplary embodiment, the blocking plate 200 may be selectively moved to a location between the substrate 20 and the nozzle 100 when blocking dispensing of the fluid F to the substrate 20 so as to immediately block dispensing of the fluid F to the substrate 20.

In the fluid dispensing apparatus 1000 according to this exemplary embodiment, the blocking plate 200 includes the protruding portion 220 including the first inclined surface 221 that extends in an inclined manner toward the nozzle 100 at an end thereof When the blocking plate 200 is disposed between the nozzle 100 and the substrate 20, the fluid F is blocked by the blocking plate 200 and may flow along the first inclined surface 221 instead of being splashed due to the blocking plate 200. The first inclined surface 221 may prevent or reduce the likelihood of splashing of the fluid F, and may prevent or reduce the likelihood of the fluid F being unexpectedly dispensed to the substrate 20 due to splashing, which could occur if the fluid F were to directly drop onto the blocking plate main body 210.

The fluid dispensing apparatus 100 may easily block dispensing of the fluid F with respect to the substrate 20.

Hereinafter, a fluid dispensing apparatus according to another exemplary embodiment will be described with reference to FIG. 2.

Hereinafter, only features distinguished from those of the previous exemplary embodiment are extracted and described. A description of features that are the same as features in the previous embodiment will not be repeated. In addition, in this exemplary embodiment, for convenience of description, the same constituent elements will be described by using the same reference numerals as the first exemplary embodiment.

Figure 2:
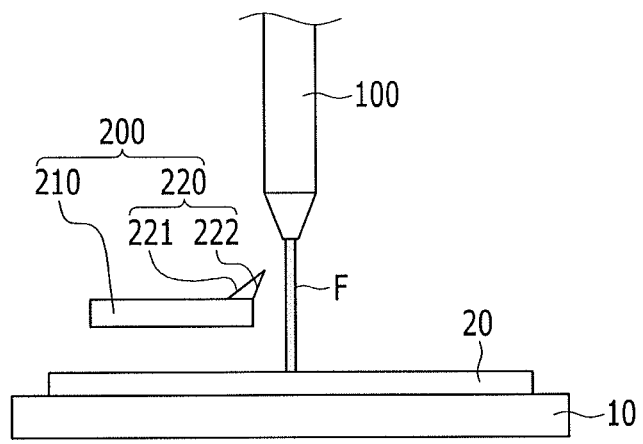
FIG. 2 schematically illustrates a side view of a fluid dispensing apparatus according to another exemplary embodiment.
Figure 2:
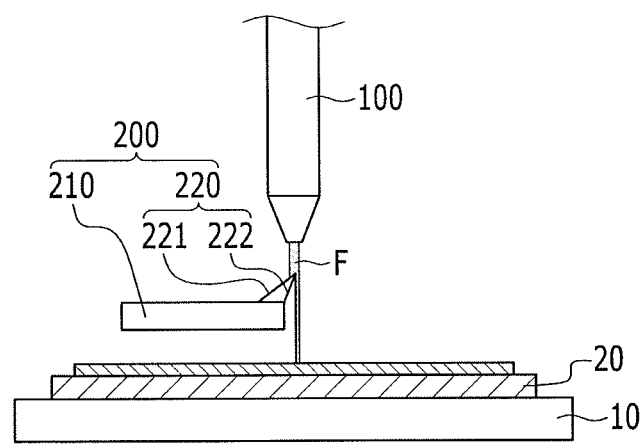

FIG. 2 schematically illustrates a side view of a fluid dispensing apparatus according to this exemplary embodiment.

As shown in (a) of FIG. 2, a protruding portion 220 of a fluid dispensing apparatus 1002 according to this exemplary embodiment includes a second inclined surface 222 that is bent and extends in a direction of a blocking plate main body 210 from an end of a first inclined surface 221. The protruding portion 220 includes the first inclined surface 221 and the second inclined surface 222 that are bent and extend from the first inclined surface 221. Accordingly, the end of the first inclined surface 221 may protrude further outside than an end of the blocking plate main body 210.

As shown in (b) of FIG. 2, in the fluid dispensing apparatus 1002 according to this exemplary embodiment, the protruding portion 220 includes the first inclined surface 221 and the second inclined surface 222. When the blocking plate 200 is disposed between the nozzle 100 and the substrate 20, the fluid F may be blocked by the blocking plate 200 along the first inclined surface 221 rather than being splashed due to the blocking plate 200. The first inclined surface 221 may prevent or reduce the likelihood of splashing of the fluid F and may prevent or reduce the likelihood of the fluid F being unexpectedly dispensed to the substrate 20 due to splashing, which could occur if the fluid F were to directly drop onto the blocking plate main body 210.

In addition, in the fluid dispensing apparatus 1002 according to this exemplary embodiment, the protruding portion 220 includes the first inclined surface 221 and the second inclined surface 222. When the blocking plate 200 is disposed between the nozzle 100 and the substrate 20 and the protruding portion 220 initially contacts the fluid F, the fluid F may be blocked from flowing toward the substrate 20 along the second inclined surface 222.

The fluid dispensing apparatus 1002 may easily block dispensing of the fluid F with respect to the substrate 20.

Hereinafter, a fluid dispensing apparatus according to another exemplary embodiment will be described with reference to FIG. 3.

Hereinafter, only features distinguished from those of the exemplary embodiment illustrated in FIG. 1 are extracted and described. A description of features that are the same as features in the embodiment illustrated in FIG. 1 will not be repeated. In addition, in the this exemplary embodiment, for convenience of description, the same constituent elements will be described by using the same reference numerals as the exemplary embodiment illustrated in FIG. 1.

Figure 3:
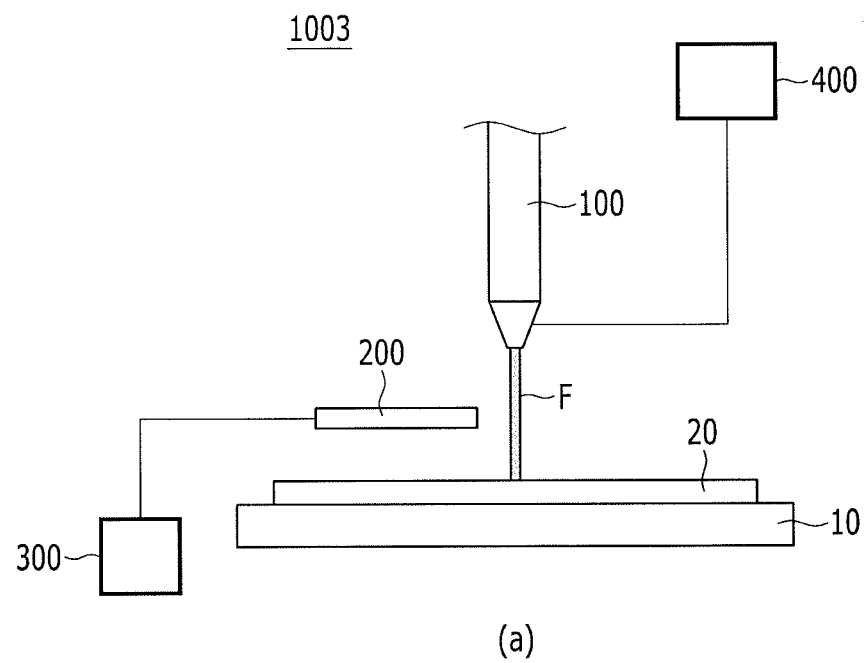
FIG. 3 schematically illustrates a side view of a fluid dispensing apparatus according to another exemplary embodiment.
Figure 3:
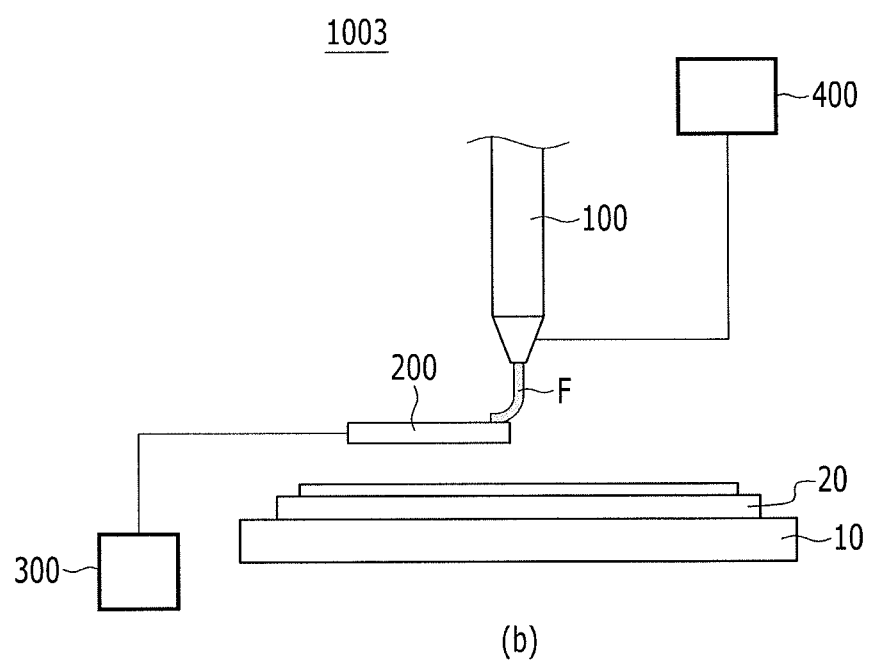

FIG. 3 schematically illustrates a side view of a fluid dispensing apparatus according to this exemplary embodiment.

As shown in (a) of FIG. 3, a fluid dispensing apparatus according to this exemplary embodiment includes a nozzle 100, a blocking plate 200, a negative potential supply unit 300, and a positive potential supply unit 400.

The negative potential supply unit 300 is connected with the blocking plate 200 and may generate a negative potential in the blocking plate 200. The negative potential supply unit 300 may generate a negative potential in the blocking plate 200 by supplying a current, an electric field, or a magnetic field to the blocking plate 200.

The positive potential supply unit 400 is connected with the nozzle 100 and may generate a positive potential in the nozzle 100. When the positive potential is generated in the nozzle 100, the positive potential may also be generated in the fluid F dispensed to the substrate 20 through the nozzle 100. The positive potential supply unit 400 may generate a positive potential in the nozzle 100 by supplying a current, an electric field, or a magnetic field to the nozzle 100.

In other implementations, the negative potential supply unit 300 may be connected with the nozzle 100, and the positive potential supply unit 400 may be connected with the blocking plate 200. One of the blocking plate 200 and the nozzle 100 is connected with the negative potential supply unit 300 and the other may be connected with the positive potential supply unit 400.

As shown in (b) of FIG. 3, the fluid dispensing apparatus 1003 according to this exemplary embodiment may generate the negative potential and the positive potential in each of the blocking plate 200 and the nozzle 100 by the negative potential supply unit 300 and the positive potential supply unit 400, respectively, when dispensing the fluid F to the substrate 20. The fluid F dispensed to the substrate 20 from the nozzle 100 may be controlled to flow toward the blocking plate 200 using a potential difference whether or not the blocking plate 200 is directly disposed between the nozzle 100 and the substrate 20. Accordingly, the fluid F can be suppressed from being unexpectedly dispensed to the substrate 20 by being splashed due to the blocking plate 200.

The fluid dispensing apparatus 1003 may easily block dispensing of the fluid F with respect to the substrate 20.

Hereinafter, a fluid dispensing apparatus according to a fourth exemplary embodiment will be described with reference to FIG. 4.

Hereinafter, only features distinguished from those of the first exemplary embodiment are extracted and described, and portions of which the description is omitted follow the first exemplary embodiment. In addition, in the third exemplary embodiment, for convenience of description, the same constituent elements will be described by using the same reference numerals as the first exemplary embodiment.

Figure 4:
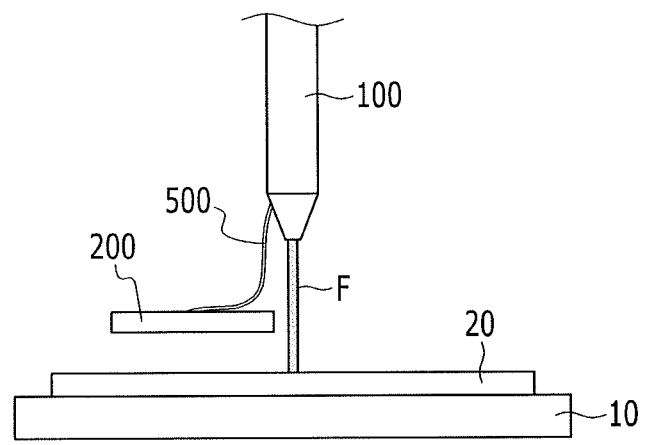
FIG. 4 schematically illustrates a side view of a fluid dispensing apparatus according to another exemplary embodiment.
Figure 4:
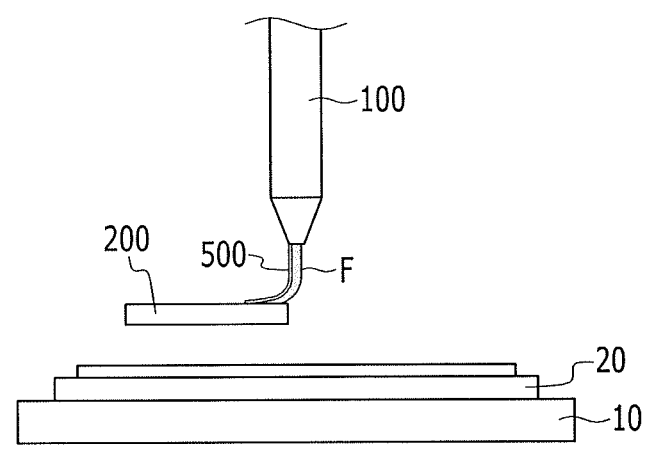

FIG. 4 illustrates a side view of a fluid dispensing apparatus according to another exemplary embodiment.

As shown in (a) of FIG. 4, a fluid dispensing apparatus 1004 according to this exemplary embodiment includes a nozzle 100, a blocking plate 200, and a connection unit 500.

The connection unit 500 connects the nozzle 100 and the blocking plate 200, and selectively contacts a fluid F. The connection unit 500 may be formed of a thread, plastic, or a wire.

As shown in (b) of FIG. 4, in the fluid dispensing apparatus 1004 according to this exemplary embodiment the connection unit 500 is put into contact with the fluid F when blocking dispensing of the fluid F with respect to the substrate 20 so that the fluid F dispensed to the substrate 20 can be controlled to flow toward the blocking plate 200 through the connection unit 500 using surface tension of the connection unit 500, regardless of whether the blocking plate 200 is disposed between the nozzle 100 and the substrate 20. The fluid F may be suppressed from being unexpectedly dispensed to the substrate 20 by being splashed due to the blocking plate 200.

The fluid dispensing apparatus 1004 may easily block dispensing of the fluid F with respect to the substrate 20.

By way of summation and review, a fluid dispensing apparatus may be used when forming an insulation layer including an organic material on a substrate. The fluid dispensing apparatus may include a nozzle dispensing a fluid including the organic material onto a substrate.

However, with general fluid dispensing apparatus it may be difficult to block or control the amount of fluid dispensed to the substrate. The amount of fluid dispensed to the substrate may be greater than the amount of being blocked because the fluid is linearly extended to a nozzle from the substrate.

In a case where a blocking plate is placed between a nozzle and a substrate, fluid may nevertheless be splashed from the blocking plate onto the substrate Embodiments provide an apparatus for dispensing a fluid having an advantage of blocking dispensing of a fluid to a substrate with ease. Embodiments may prevent a fluid from being splashed from a blocking plate onto a substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An apparatus that dispenses a fluid onto a substrate, the apparatus including:
    a nozzle located in a position relative to the substrate to dispense the fluid onto the substrate;
    a blocking plate selectively disposed between the substrate and the nozzle; and
    a connection unit directly connecting the nozzle and the blocking plate, the connection unit selectively contacting the fluid,
    the apparatus suppressing splashing of the fluid from the blocking plate onto the substrate.

2. The apparatus as claimed in claim 1, wherein the connection unit is put into contact with the fluid when blocking dispensing of the fluid with respect to the substrate so that the fluid dispensed from the nozzle is controlled to flow toward the blocking plate through the connection unit using surface tension of the connection unit.

3. The apparatus as claimed in claim 1, wherein the connection unit controls flow of the fluid dispensed from the nozzle toward the blocking plate when the blocking plate is not disposed in a flow path from the nozzle to the substrate.

4. The apparatus as claimed in claim 1, wherein the connection unit suppresses splashing of the fluid from the blocking plate onto the substrate.

5. An apparatus that dispenses a fluid onto a substrate, the apparatus including:
    a nozzle located in a position relative to the substrate to dispense the fluid onto the substrate; and
    a blocking plate selectively disposed between the substrate and the nozzle, wherein the blocking plate includes:
    a blocking plate main body; and
    a protruding portion on an end of the blocking plate main body, the protruding portion including a first inclined surface that is bent and extends upward from a surface of the blocking plate main body.

6. The apparatus as claimed in claim 5, wherein the protruding portion further includes a second inclined surface that is bent and extended in a direction toward the blocking plate main body from an end of the first inclined surface.

7. The apparatus as claimed in claim 6, wherein the end of the first inclined surface protrudes beyond an end of the blocking plate main body.

8. An apparatus that dispenses a fluid onto a substrate, the apparatus comprising:
    a nozzle located in a position relative to the substrate to dispense the fluid onto the substrate;
    a blocking plate selectively disposed between the substrate and the nozzle;
    a negative potential supply unit connected with one of the blocking plate and the nozzle and generating a negative potential therein; and
    a positive potential supply unit connected with the other one of the blocking plate and the nozzle and generating a positive potential therein.

\* \* \* \* \*